US009190390B2

(12) United States Patent
Gong et al.

(10) Patent No.: US 9,190,390 B2
(45) Date of Patent: *Nov. 17, 2015

(54) STACKED MICROELECTRONIC PACKAGES HAVING SIDEWALL CONDUCTORS AND METHODS FOR THE FABRICATION THEREOF

(75) Inventors: Zhiwei (Tony) Gong, Chandler, AZ (US); Michael B Vincent, Chandler, AZ (US); Scott M Hayes, Chandler, AZ (US); Jason R Wright, Chandler, AZ (US)

(73) Assignee: FREESCALE SEMICONDUCTOR INC., Austin, TX (US)

( * ) Notice: Subject to any disclaimer, the term of this patent is extended or adjusted under 35 U.S.C. 154(b) by 65 days.

This patent is subject to a terminal disclaimer.

(21) Appl. No.: 13/591,924

(22) Filed: Aug. 22, 2012

(65) Prior Publication Data

US 2014/0054783 A1    Feb. 27, 2014

(51) Int. Cl.
*H01L 21/00* (2006.01)
*H01L 25/065* (2006.01)
*H01L 23/00* (2006.01)

(52) U.S. Cl.
CPC .............. *H01L 25/065* (2013.01); *H01L 24/19* (2013.01); *H01L 24/96* (2013.01); *H01L 24/97* (2013.01); *H01L 2224/16225* (2013.01); *H01L 2224/32225* (2013.01); *H01L 2224/48091* (2013.01); *H01L 2224/48227* (2013.01); *H01L 2224/48247* (2013.01); *H01L 2224/73265* (2013.01); *H01L 2224/97* (2013.01); *H01L 2924/1461* (2013.01); *H01L 2924/15311* (2013.01)

(58) Field of Classification Search
CPC ............... H01L 2924/00; H01L 2924/00014; H01L 2224/16225; H01L 2924/0002; H01L 2924/13091; H01L 2224/32225; H01L 2224/73204; H01L 21/78; H01L 2224/13155; H01L 2224/13111; H01L 2224/48227; H01L 2224/07

See application file for complete search history.

(56) References Cited

U.S. PATENT DOCUMENTS

| 4,866,501 A | * | 9/1989 | Shanefield | .................... 257/684 |
| 5,019,946 A | | 5/1991 | Eichelberger et al. | |
| 5,279,991 A | | 1/1994 | Minahan et al. | |

(Continued)

OTHER PUBLICATIONS

USPTO, Final Office Action for U.S. Appl. No. 13/591,990, mailed Dec. 19, 2013.

(Continued)

*Primary Examiner* — Robert Bachner
(74) *Attorney, Agent, or Firm* — Ingrassia Fisher & Lorenz, P.C.

(57) ABSTRACT

Methods for fabricating stacked microelectronic packages are provided, as are embodiments of a stacked microelectronic package. In one embodiment, the method includes arranging a plurality of microelectronic device panels in a panel stack. Each microelectronic device panel contains plurality of microelectronic devices and a plurality of package edge conductors extending therefrom. Trenches are created in the panel stack exposing the plurality of package edge conductors, and a plurality of sidewall conductors is formed interconnecting different ones of the package edge conductors exposed through the trenches. The panel stack is then separated into a plurality of stacked microelectronic packages each including at least two microelectronic devices electrically interconnected by at least one of the plurality of sidewall conductors included within the stacked microelectronic package.

20 Claims, 10 Drawing Sheets

(56) References Cited

U.S. PATENT DOCUMENTS

| | | | |
|---|---|---|---|
| 5,432,729 | A | 7/1995 | Carson et al. |
| 5,465,186 | A | 11/1995 | Bajorek et al. |
| 5,675,180 | A | 10/1997 | Pedersen et al. |
| 5,847,448 | A | 12/1998 | Val et al. |
| 5,977,640 | A | 11/1999 | Bertin et al. |
| 6,467,880 | B2 | 10/2002 | Rhodes |
| 6,560,109 | B2 | 5/2003 | Yamaguchi et al. |
| 6,607,941 | B2 | 8/2003 | Prabhu et al. |
| 6,674,159 | B1 | 1/2004 | Peterson |
| 6,818,977 | B2 | 11/2004 | Poo et al. |
| 6,822,191 | B2 | 11/2004 | De Steur et al. |
| 6,855,572 | B2 | 2/2005 | Jeung et al. |
| 7,394,152 | B2 | 7/2008 | Yu et al. |
| 7,560,215 | B2 | 7/2009 | Sharma et al. |
| 7,723,159 | B2 | 5/2010 | Do et al. |
| 7,732,907 | B2 | 6/2010 | Han et al. |
| 7,741,156 | B2 * | 6/2010 | Pagaila et al. ............... 438/113 |
| 7,759,800 | B2 | 7/2010 | Rigg et al. |
| 7,829,998 | B2 | 11/2010 | Do et al. |
| 7,838,979 | B2 | 11/2010 | Oh |
| 7,843,046 | B2 | 11/2010 | Andrews et al. |
| 7,951,649 | B2 | 5/2011 | Val |
| 7,972,650 | B1 | 7/2011 | Church et al. |
| 7,994,621 | B2 | 8/2011 | Kim |
| 8,012,802 | B2 | 9/2011 | Sasaki et al. |
| 8,247,268 | B2 | 8/2012 | Do et al. |
| 8,362,621 | B2 | 1/2013 | Lee et al. |
| 8,796,561 | B1 | 8/2014 | Scanlan et al. |
| 2002/0121702 | A1 | 9/2002 | Higgins, III |
| 2003/0138610 | A1 | 7/2003 | Tao |
| 2006/0043569 | A1 * | 3/2006 | Benson et al. ............... 257/698 |
| 2008/0274603 | A1 * | 11/2008 | Do et al. ............... 438/462 |
| 2009/0039528 | A1 | 2/2009 | Haba et al. |
| 2009/0134527 | A1 | 5/2009 | Chang |
| 2009/0160065 | A1 * | 6/2009 | Haba et al. ............... 257/777 |
| 2009/0230533 | A1 | 9/2009 | Hoshino et al. |
| 2010/0001407 | A1 | 1/2010 | Krause et al. |
| 2010/0140811 | A1 | 6/2010 | Leal et al. |
| 2010/0270668 | A1 | 10/2010 | Marcoux |
| 2010/0320584 | A1 | 12/2010 | Takano |
| 2011/0012246 | A1 | 1/2011 | Andrews, Jr. et al. |
| 2011/0037159 | A1 | 2/2011 | McElrea et al. |
| 2011/0304011 | A1 | 12/2011 | Lee |
| 2012/0119385 | A1 | 5/2012 | Co et al. |
| 2012/0187577 | A1 | 7/2012 | Cordes et al. |
| 2012/0193785 | A1 | 8/2012 | Lin et al. |
| 2012/0313209 | A1 | 12/2012 | Oganesian |
| 2013/0010441 | A1 | 1/2013 | Oganesian et al. |
| 2013/0049225 | A1 | 2/2013 | Kang et al. |
| 2014/0054783 | A1 | 2/2014 | Gong et al. |
| 2014/0054797 | A1 | 2/2014 | Gong et al. |

OTHER PUBLICATIONS

USPTO, Office Action for U.S. Appl. No. 13/591,990, mailed Jul. 5, 2013.
USPTO, Office Action for U.S. Appl. No. 13/591,969, mailed Sep. 13, 2013.
USPTO, Final Office Action for U.S. Appl. No. 13/591,969, mailed Feb. 14, 2014.
USPTO, Response to Non-Final Office Action for U.S. Appl. No. 13/591,969, mailed Dec. 13, 2013.
U.S. Appl. No. 13/829,737, Office Action—Restriction, mailed May 23, 2014.
U.S. Appl. No. 13/829,737, Office Action—Pre-Interview Communication (Pilot Program), mailed Aug. 14, 2014.
USPTO, Final Office Action for U.S. Appl. No. 13/591,969, mailed Sep. 22, 2014.
Rabaey, J. et al., Digital Integrated Circuits, 2003, Pearson Education, Second Edition, 38-40.
USPTO, Notice of Allowance and Fee(s) Due for U.S. Appl. No. 13/591,969 mailed Jan. 28, 2015.
USPTO, Notice of Allowance and Fee(s) Due for U.S. Appl. No. 13/591,990 mailed Feb. 17, 2015.
USPTO, Notice of Allowance and Fee(s) Due for U.S. Appl. No. 13/591,969 mailed Apr. 2, 2015.
Non-Final Office Action mailed Feb. 12, 2015 for U.S. Appl. No. 14/097,459, 16 pages.
Restriction Requirement mailed Mar. 29, 2013 for U.S. Appl. No. 13/591,990, 4 pages.
Restriction Requirement mailed Jan. 29, 2015 for U.S. Appl. No. 14/097,424, 8 pgs.
Non-Final Office Action mailed Nov. 18, 2014 for U.S. Appl. No. 13/906,621, 5 pages.
Final Office Action mailed Dec. 5, 2014 for U.S. Appl. No. 13/829,737, 10 pages.
Notice of Allowance mailed Feb. 3, 2015 for U.S. Appl. No. 14/042,628, 12 pages.
U.S. Appl. No. 13/591,969, filed Aug. 22, 2012, entitled "Stacked Microelectronic Packages Having Patterned Sidewall Conductors and Methods for the Fabrication Thereof".
U.S. Appl. No. 14/573,519, filed Dec. 17, 2014, entitled "Microelectronic Devices with Mutli-Layer Package Surface Conductors and Methods of Their Fabrication".
U.S. Appl. No. 13/591,990, filed Aug. 22, 2012, entitled "Stacked Microelectronic Packages Having Sidewall Conductors and Methods for the Fabrication Thereof".
U.S. Appl. No. 13/829,737, filed Mar. 14, 2013, entitled "Stacked Microelectronic Packages Having Sidewall Conductors and Methods for the Fabrication Thereof".
U.S. Appl. No. 13/906,621 filed May 31, 2013, entitled "Stacked Microelectronic Packages Having Sidewall Conductors and Methods for the Fabrication Thereof".
U.S. Appl. No. 14/042,623, filed Sep. 30, 2013, entitled "Devices and Stacked Microelectronic Packages with Parallel Conductors and Intra-Conductor Isolator Structures and Method of their Fabrication".
U.S. Appl. No. 14/042,628, filed Sep. 30, 2013, entitled "Devices and Stacked Microelectronic Packages with In-Trench Package Surface Conductors and Methods of Their Fabrication".
U.S. Appl. No. 14/097,424, filed Dec. 5, 2013, entitled "Devices and Stacked Microelectronic Packages with Package Surface Conductors and Methods of Their Fabrication".
U.S. Appl. No. 14/097,459, filed Dec. 5, 2013, entitled "Devices and Stacked Microelectronic Packages with Package Surface Conductors and Adjacent Trenches and Methods of Their Fabrication".
Non-Final Office Action mailed Mar. 6, 2015 for U.S. Appl. No. 13/829,737, 11 pages.
Notice of Allowance mailed Feb. 17, 2015 for U.S. Appl. No. 13/591,990, 5 pages.
Notice of Allowance mailed Mar. 5, 2015 for U.S. Appl. No. 14/042,623, 14 pages.
Notice of Allowance mailed Apr. 2, 2015 for U.S. Appl. No. 13/591,969, 8 pages.
Final Office Action mailed May 12, 2015 for U.S. Appl. No. 13/906,621, 11 pages.
Non-Final Office Action mailed May 22, 2015 for U.S. Appl. No. 14/097,424, 13 pages.
Final Office Action mailed Aug. 11, 2015 for U.S. Appl. No. 13/829,737, 11 pages.
Non-Final Office Action mailed Jul. 31, 2015 for U.S. Appl. No. 14/706,359, 7 pages.
Non-Final Office Action mailed Sep. 3, 2015 for U.S. Appl. No. 13/906,621, 14 pages.
Final Office Action mailed Sep. 4, 2015 for U.S. Appl. No. 14/097,459, 10 pages.
Notice of Allowance mailed Oct. 8, 2015 for U.S. Appl. No. 14/097,424, 9 pages.

* cited by examiner

STACKED MICROELECTRONIC PACKAGES HAVING SIDEWALL CONDUCTORS AND METHODS FOR THE FABRICATION THEREOF

CROSS-REFERENCE TO RELATED APPLICATIONS

This application relates to the following co-pending applications, each of which is hereby incorporated by reference: U.S. application Ser. No. 13/591,969, filed with the United States Patent and Trademark Office (USPTO) on Aug. 22, 2012, and U.S. application Ser. No. 13/591,990, filed with USPTO on Aug. 22, 2012.

TECHNICAL FIELD

Embodiments of the present invention relate generally to microelectronic packaging and, more particularly, to stacked microelectronic packages having sidewall conductors and methods for the fabrication thereof.

BACKGROUND

It is often useful to combine multiple microelectronic devices, such as semiconductor die carrying integrated circuits (ICs), microelectromechanical systems (MEMS), optical devices, passive electronic components, and the like, into a single package that is both compact and structurally robust. Packaging of microelectronic devices has traditionally been carried-out utilizing a so-called two dimensional (2D) or non-stacked approach in which two or more microelectronic devices are positioned and interconnected in a side-by-side or laterally adjacent spatial relationship. More particularly, in the case of ICs formed on semiconductor die, packaging has commonly entailed the mounting of multiple die to a package substrate and formation of the desired electrical connections through wire bonding or flip-chip (FC) connections. The 2D microelectronic package may then later be incorporated into a larger electronic system by mounting the package substrate to a printed circuit board (PCB) or other component included within the electronic system.

As an alternative to 2D packaging technologies of the type described above, three dimensional (3D) packaging technologies have recently been developed in which microelectronic devices are disposed in a stacked arrangement and vertically interconnected to produce a stacked, 3D microelectronic package. Such 3D packaging techniques yield highly compact microelectronic packages well-suited for usage within mobile phones, digital cameras, digital music players, and other compact electronic devices. Additionally, such 3D packaging techniques enhance device performance by reducing interconnection length, and thus signal delay, between the packaged microelectronic devices. Considerable efforts have been expended in the development of so-called "Package-on-Package" or, more simply, "PoP" packaging technologies. In a conventional PoP packaging approach, vertical interconnection of the stacked microelectronic devices is performed on a package level. That is, subsequent to singulation into individual die via wafer dicing, the semiconductor die are encapsulated to produce a number of discrete die packages. The die packages (also referred to as "package layers" when included within a PoP package) are then stacked and vertically interconnected to produce the completed PoP package. Emerging PoP technologies include Wire Bond (WB) Ball Grid Array (BGA) PoP, FC PoP, Thru Mold Via (TMV) FC PoP, and Redistributed Chip Package (RCP) PoP packaging approaches.

BRIEF DESCRIPTION OF THE DRAWINGS

At least one example of the present invention will hereinafter be described in conjunction with the following figures, wherein like numerals denote like elements, and.

Figure 1:
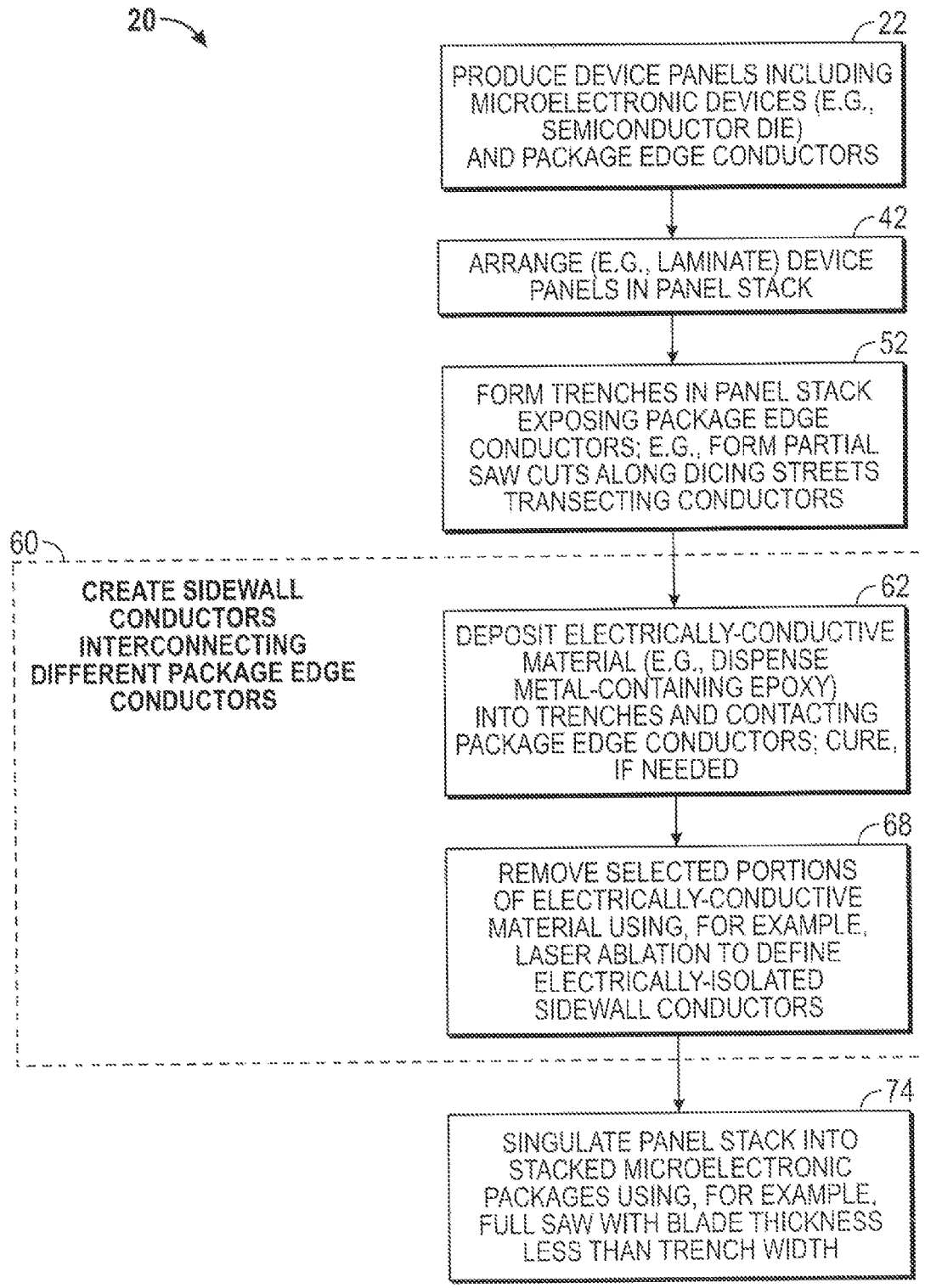
FIG. 1 is a flowchart illustrating a method for fabricating stacked microelectronic packages, as illustrated in accordance with an exemplary and non-limiting embodiment of the present invention.

For simplicity and clarity of illustration, the drawing figures illustrate the general manner of construction, and descriptions and details of well-known features and techniques may be omitted to avoid unnecessarily obscuring the exemplary and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

The following Detailed Description is merely exemplary in nature and is not intended to limit the invention or the application and uses of the invention. Any implementation described herein as exemplary is not necessarily to be construed as preferred or advantageous over other implementations. Furthermore, there is no intention to be bound by any theory presented in the preceding Background or the following Detailed Description.

Terms "first," "second," "third," "fourth," and the like, if appearing in the description and the subsequent claims, may be utilized to distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have," and similar terms are intended to cover non-exclusive inclusions, such that a process, method, article, or apparatus that comprises a list of elements is not necessarily limited to those elements, but may include other elements not expressly listed or inherent to such process, method, article, or apparatus. The term "coupled," as appearing herein, is defined as directly or indirectly connected in an electrical or non-electrical manner. Furthermore, the terms "substantial" and "substantially" are utilized to indicate that a particular feature or condition is sufficient to accomplish a stated purpose in a practical manner and that minor imperfections or variations, if any, are not significant for the stated purpose.

As appearing herein, the term "microelectronic device" is utilized in a broad sense to refer to an electronic device, element, or component produced on a relatively small scale and amenable to packaging in the below-described manner. Microelectronic devices include, but are not limited to, integrated circuits formed on semiconductor die, microelectromechanical systems, passive electronic components, optical devices, and other small scale electronic devices capable of providing processing, memory, sensing, radiofrequency, optical, and actuator functionalities, to list but a few examples. Furthermore, the term "microelectronic package" is utilized herein to denote a structure or assembly containing at least one and typically two or more microelectronic devices, which may or may not be electrically interconnected; and the term "stacked microelectronic package" is utilized to refer to a microelectronic package containing at least two microelectronic devices located within different levels or overlying layers of the microelectronic package. Finally, the term "stacked microelectronic devices" is utilized to collectively refer to two or more microelectronic devices, which are located on different levels of a stacked microelectronic package, as previously defined. The term "stacked microelectronic devices" thus does not require that one microelectronic device is necessarily positioned directly above or beneath another.

The following describes exemplary embodiments of a method for fabricating stacked microelectronic packages, which may overcome certain limitations associated with conventional PoP packaging approaches and other known packaging technologies of the type described above. Advantageously, embodiments of the below-described fabrication method can be implemented through the processing of large scale, pre-singulated microelectronic device panels, which each contain a plurality of microelectronic devices embedded or encapsulated within a panel body. The device panels are positioned and conveniently bonded as panel stacks, which are ultimately separated or singulated into a number of discrete package units each containing at least two microelectronic devices electrically interconnected by a number of conductors formed over the package sidewall and referred to herein as "package sidewall conductors" or "package sidewall interconnects." Additionally or alternatively, the package sidewall conductors can be utilized to provide a convenient means of electrically coupling a microelectronic device contained within lower package layer to contacts included within a contact formation formed over an upper package layer. As embodiments of the below-described fabrication method are performed on a panel or partial panel level prior to full singulation of the device panels, the below-described fabrication method may improve efficiency, cost effectiveness, scalability, and overall productivity as compared to conventional packaging techniques wherein interconnection of stacked packages or package layers is carried-out at a die level or at a post-singulation package level. As a further advantage, the below-described fabrication method may eliminate or reduce the need for vertical connection between package layers utilizing BGAs or similar contact formations thereby enabling a more compact vertical device profile and decreasing manufacturing complexity.

Figure 2:
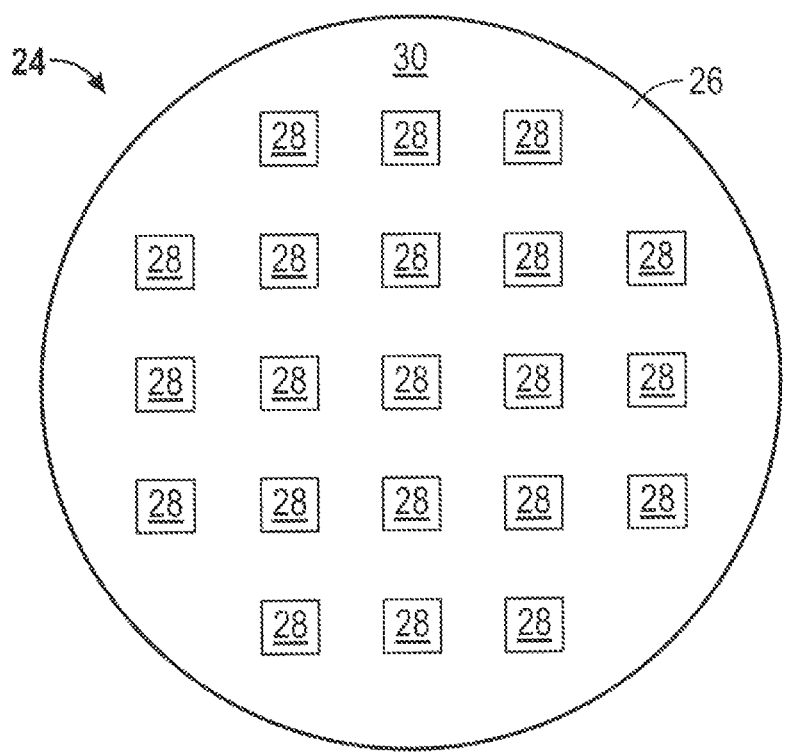
FIGS. 2-13 illustrate an exemplary stacked microelectronic package at various stages of manufacture and produced in accordance with the exemplary fabrication method shown in FIG. 1.

Exemplary method 20 commences with the production of a number of microelectronic device panels each containing an array of microelectronic devices (STEP 22, FIG. 1). FIG. 2 is a top-down view illustrating a partially-completed device panel 24, which may be produced during STEP 22 of method 20. It can be seen in FIG. 2 that exemplary device panel 24 includes a panel body 26 in which a plurality of microelectronic devices 28 are embedded. Devices 28 are exposed through major surface 31 of panel body 26 (referred to herein as "device surface 31") at this juncture in the fabrication process, but will subsequently be covered by one or more additional layers of material, as described below in conjunction with FIG. 3. In the illustrated exemplary embodiment, device panel 24 includes twenty one square-shaped devices 28 arranged in a grid pattern or array; however, the number of microelectronic devices, the planform dimensions of the microelectronic devices (e.g., the die shape), and the manner in which the devices are spatially distributed within panel body 26 may vary amongst embodiments. As indicated in FIG. 2, panel body 26 is conveniently produced as a relatively thin, disc-shaped body or mass having a generally circular planform geometry; however, panel body 26 can be fabricated to have any desired shape and dimensions. Panel body 26 is conveniently produced to have a thickness equivalent to or only slightly exceeding the maximum height of microelectronic devices 28 (i.e., the die height when devices 28 are semiconductor die) to minimize the overall vertical profile of the completed stacked microelectronic package.

Device panel 24 is conveniently produced utilizing a Fan-Out Wafer Level Packaging (FO-WLP) approach, such as Redistributed Chip Packaging (RCP) manufacturing processes. By way of non-limiting example, one RCP process suitable for fabricating device panel 24 may be performed as follows. First, microelectronic devices 28 are distributed in a desired spatial arrangement over the surface of a support substrate or carrier; e.g., devices 28 may be arranged over the carrier in a grid array of the type shown in FIG. 2. If desired, one more release layers may also be applied or otherwise formed over the carrier's supper surface prior to positioning of the microelectronic devices. A mold frame, which has a central cavity or opening therethrough, is positioned over the carrier and around the array of microelectronic devices 28. An encapsulant, such as a silica-filled epoxy, is then dispensed into the cavity of the mold frame and flows over microelectronic devices 28. Sufficient volume of the encapsulant is typically dispensed over microelectronic devices 28 to enable the encapsulant to flow over the uppermost or non-contact-bearing surfaces of devices 28. The encapsulant may then be solidified by, for example, an oven cure to yield a solid panel body in which microelectronic devices 28 are embedded. The panel body may be rigid or flexible, depending upon the chosen encapsulant. The panel body is then released from the carrier to reveal the backside of the panel body through which devices 28 are exposed; i.e., device surface 31 in the exemplary embodiment shown in FIG. 2. If desired, the front side of the panel body may be ground or polished to bring device panel 24 to a desired thickness prior to release of the panel body from the carrier. The foregoing example notwithstanding, panel body 26 can be produced utilizing various other known fabrication techniques including, for example, compression molding and lamination processes.

After encapsulation of microelectronic devices 28 within panel body 26, a plurality of package edge conductors is next fabricated over device surface 31 of device panel 24. As utilized herein, the term "package edge conductor" refers to an electrically-conductive element, such as a metal trace, a wire, an interconnect line, a metal-filled trench, a bond pad, or the like, which is electrically coupled to a microelectronic device embedded within a package or package layer and which extends to a sidewall or edge portion of the package or package layer to contact a package sidewall conductor, such as the sidewall conductors described below in conjunction with FIGS. 12 and 18. The package edge conductors can assume a wide variety of different forms and, in certain embodiments, may comprise a number of electrically-conductive lines (e.g., metal traces), vias, metal plugs, and the like, which are formed in a number of dielectric layers (commonly referred to as a "build-up layers," "metal layers," or "redistribution layers" (RDLs)), which collectively provide an electrically conductive path between an encapsulated microelectronic device and a package sidewall and, thus, to a package sidewall conductor formed over the package sidewall.

Figure 3:
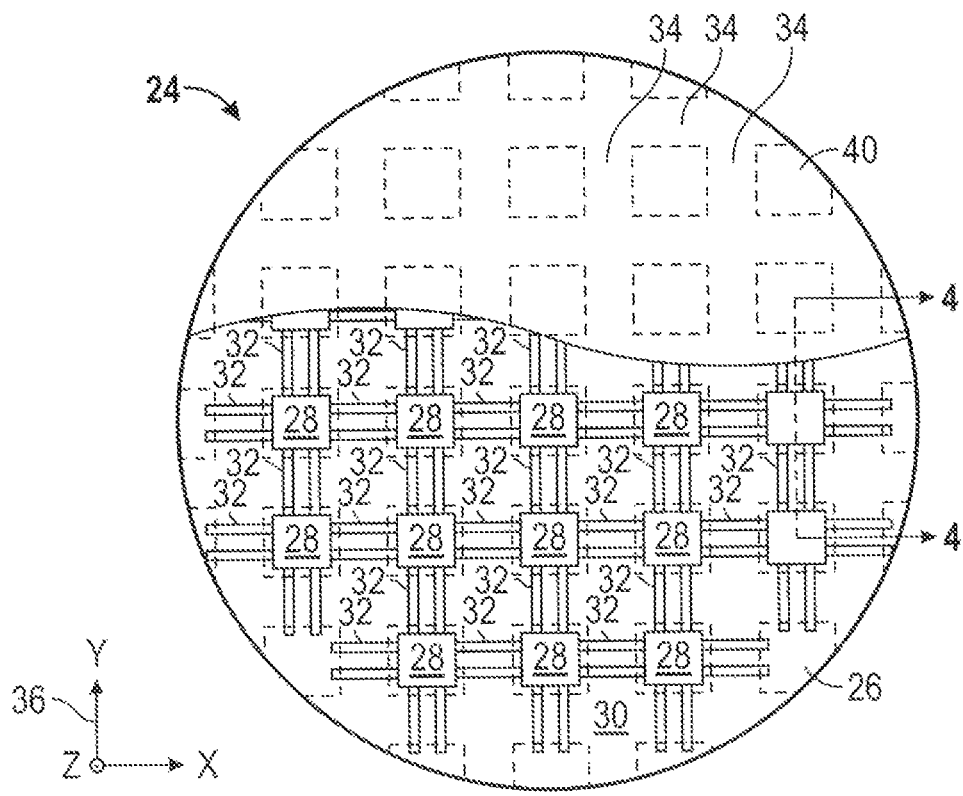
Figure 4:
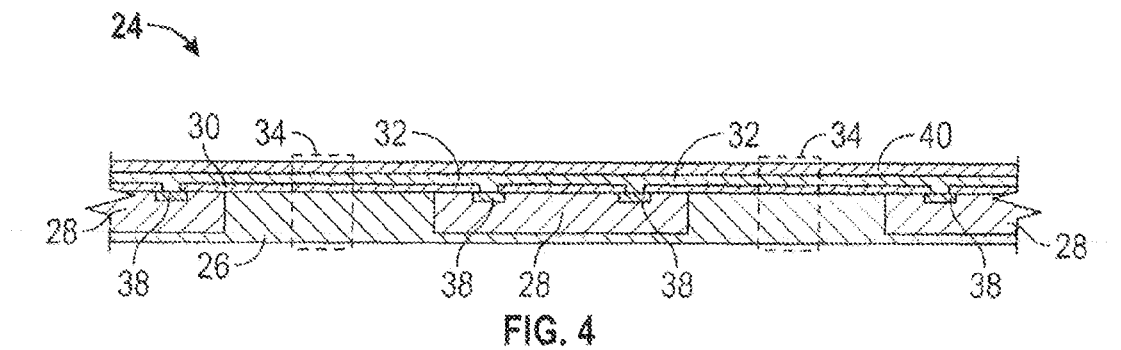

By way of non-limiting example, FIG. 3 illustrates a number of package edge conductors 32 that can be formed over device surface 31 of panel 24 during STEP 22 of method 20 (FIG. 1); and FIG. 4 is a cross-sectional view of a portion of microelectronic device panel 24, as taken along line 4-4 identified in FIG. 3. In this example, package edge conductors 32 assume the form of a number of interconnect lines or metal (e.g., copper) traces and will consequently be referred to as "traces 32" hereafter. In the exemplary embodiment shown in FIG. 3, traces 32 extend along a plane parallel with device surface 31 or, stated differently, along the x-y plane identified in FIG. 3 by coordinate legend 36. Traces 32 are conveniently produced utilizing standard bumping or wafer level packaging fabrication techniques well-known within the semiconductor industry, such as sputtering or plating processes. As will be readily appreciated, traces 32 will typically be formed in one or more layers of dielectric material 30 (shown in FIG. 4 and not shown in FIG. 3 to more clearly illustrate the relative positioning of microelectronic devices 28 with respect to traces 32). As can be seen most readily in FIG. 4, package edge conductors 32 are electrically coupled to a number of landing pads or other electrical contact points 38 provided on each microelectronic device 28 (only one of which is fully shown in FIG. 4). Package edge conductors 32 may be electrically connected to device contact points 38 (e.g., pads) by filled vias, plated vias, metal plugs, or the like formed through the dielectric layer underlying package edge conductors 32 utilizing bumping, wafer level packaging, or other known processing techniques. In one embodiment, traces 32 are patterned such that the traces are selectively coupled to specific contact points 38 of microelectronic devices 28. After formation of package edge conductors 32, an overlying dielectric, capping, or passivation layer 40 (partially shown in FIG. 3 and fully shown in FIG. 4) may be formed over package edge conductors 32 utilizing, for example, spin-on coating, printing, lamination, or other deposition technique.

With continued reference to FIGS. 3 and 4, package edge conductors 32 extend from their respective microelectronic devices 28 to neighboring dicing streets 34, which surround or border each device 28 and which are generically represented in FIG. 3 by intersecting dashed columns and rows. Dicing streets 34 represent portions of device panel 24 located between and around devices 28, which lack electrically-active elements and along which the stacked microelectronic packages are divided during singulation, as described below in conjunction with FIGS. 12 and 13. Dicing streets 34 are also commonly referred to as "saw streets"; however, the term "dicing streets" is used herein to emphasize that, while it is preferred that the singulation is accomplished through a mechanical sawing process, other dicing techniques can also be employed to separate the stacked microelectronic packages during the below-described singulation process including, for example, laser cutting and scribing with punching. As indicated in FIGS. 3 and 4, neighboring package edge conductors 32 that align on the same axis along which the conductors extend (i.e., the x- or y-axis identified in FIG. 3) are conveniently formed to connect or meet within dicing streets 34 and thereby form a continuous conductive line extending between neighboring microelectronic devices 28; however, this is by no means necessary as the portions of package edge conductors 32 extending into dicing streets 34 are ultimately removed during processing and, specifically, during the "half saw" or non-penetrating trench formation process described below in conjunction with STEP 52 of exemplary method 20.

Figure 5:
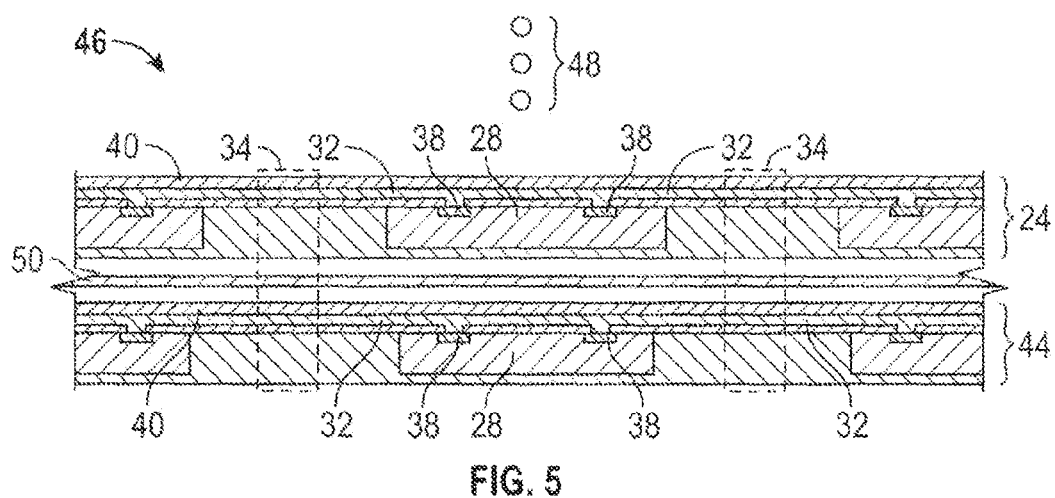
Figure 6:
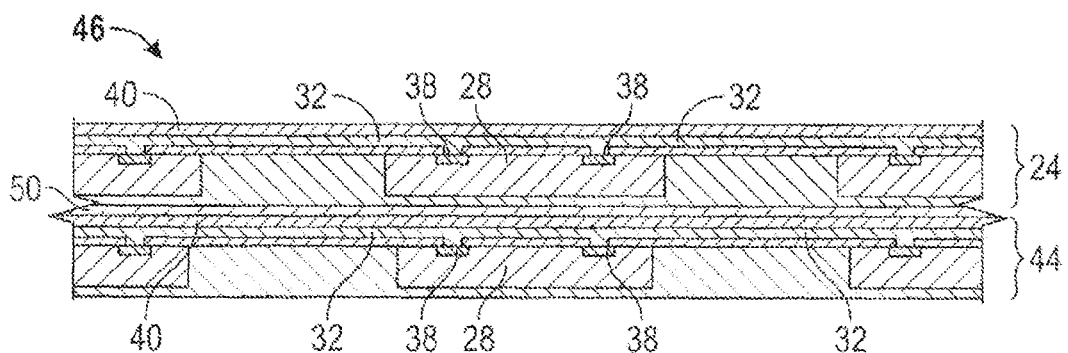

Continuing with exemplary fabrication method 20, the microelectronic device panels are next consolidated into a panel stack (STEP 42, FIG. 1). FIGS. 5 and 6 illustrate, in exploded cross-sectional and cross-sectional views, respectively, one manner in which device panel 24 may be positioned in a vertically overlapping relationship with an additional device panel 44 to produce an exemplary panel stack 46 (partially shown). For convenience of explanation, device panel 44 is illustrated and described below as being substantially identical to device panel 24; e.g., as does device panel 24, device panel 44 includes a panel body 26, a number of microelectronic devices 28 embedded in the panel body 26, and a plurality of package edge conductors 32 (e.g., metal traces) extending from devices 28 to dicing streets 34. It will be appreciated, however, that device panel 44, and the microelectronic device or devices contained therein, will typically differ from device panel 24 in structure and function. Furthermore, as indicated in FIG. 5 by ellipses 48, any practical number of additional device panels may also be included within the panel stack. In view of the illustrated orientation of panel stack 46, device panel 24 will be referred to as "upper device panel 24" herein below, while device panel 44 is referred to as "lower device panel 44." It should be understood that this terminology is used for convenience of reference only, and that the orientation of the completed stacked package is largely arbitrary. For example, the completed microelectronic package will typically be inverted during mounting to a PCB or other component included within a larger electronic system.

When panels 24 and 44 are properly positioned within panel stack 46, the dicing streets of device panels 24 and 44 overlap, as taken along the vertical or z-axis (identified by legend 36 in FIG. 3) or as taken through the thickness of the panel stack (indicated in FIG. 5 by enlarged dashed boxes 34). Panels 24 and 44, and any additional microelectronic device panels included in panel stack 46, are advantageously laminated together during the production of panel stack 46. For example, an intervening bonding layer 50 may be applied or otherwise disposed between microelectronic device panels 24 and 44 prior to stacking Bonding layer 50 can be an epoxy or other adhesive, which may be applied over the upper surface of lower device panel 44 and thermally cured after positioning of upper device panel 24. This example notwithstanding, any suitable bonding material or means can be utilized to bond panels 24 and 44 together including, for example, double-sided adhesive tape. By laminating microelectronic device panels 24 and 44 together in this manner, the relative positioning of panels 24 and 44 and, therefore, the relative positioning of the microelectronic devices 28 embedded within panels 24 and 44 can be maintained during processing and after singulation into discrete stacked microelectronic packages.

After consolidation of microelectronic device panels 24 and 44 into panel stack 46 in the above-described manner, a number of openings or trenches are next formed in microelectronic panel stack 46 at selected locations (STEP 52, FIG. 1). Notably, the trenches created in panel stack 46 are formed through an upper surface thereof to transect package edge conductors 32 (FIGS. 5 and 6) embedded within the panel stack and included within device panels 24 and 44. In this manner, the trenches formed in panel stack 46 expose package edge conductors 32 (FIGS. 5 and 6) through the upper surface of panel stack 46 to permit the deposition of an electrically-conductive material into the trenches, which can subsequently be patterned to yield package sidewall conductors interconnecting the package layers in the manner described below. The term "trench" is utilized herein to indicate that the openings formed in panel stack 46 will typically have an elongated, generally linear planform shape. This is, however, by no means necessary; and the term "trench," as appearing herein, is defined to include any opening formed in a microelectronic panel stack and exposing one or more package edge conductors, as previously defined.

Figure 7:
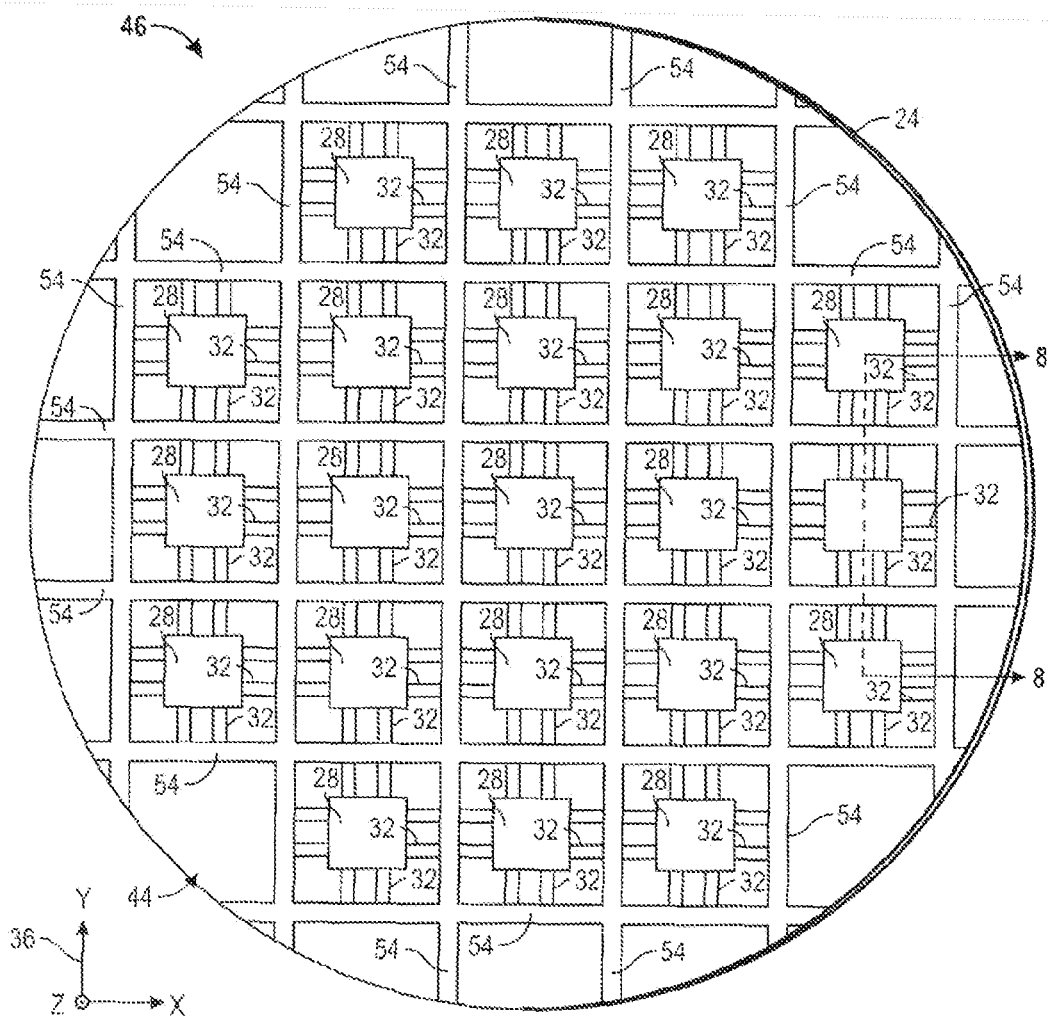
Figure 8:
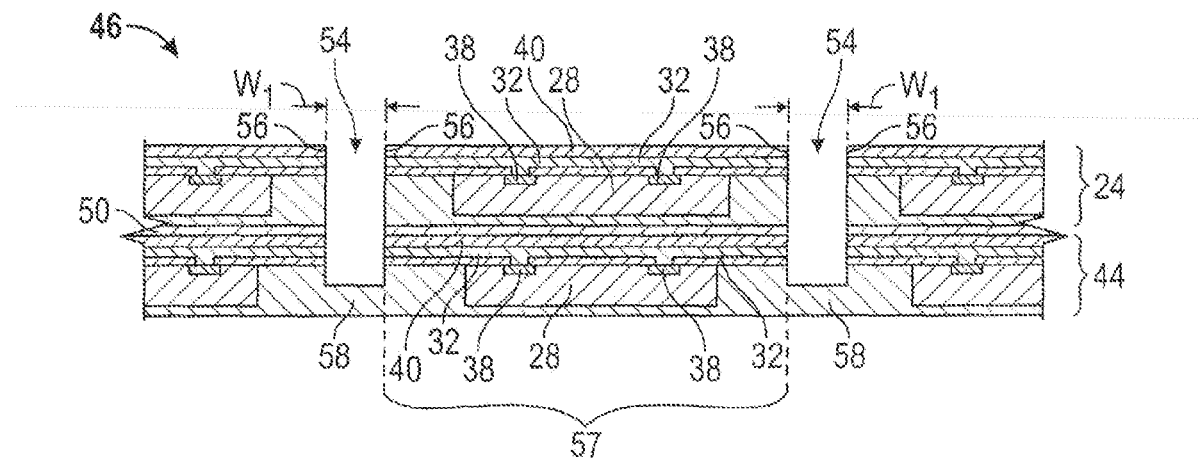

FIGS. 7 and 8 are top-down and cross-sectional views, respectively, of exemplary panel stack 46 after the formation of a plurality of trenches 54 in panel stack 46, as illustrated in accordance with an exemplary embodiment (STEP 52, method 20). As indicated above, trenches 54 are conveniently formed as non-penetrating vertical openings or slots, which extend from the uppermost surface of device panel 24, entirely through the body of panel 24, and into, but not through, lower device panel 44. As a result, lower connecting portions 58 of lower device panel 44 are left intact immediately below trenches 54 preventing premature singulation of panel stack 46 thereby enabling continued performance of subsequent processing steps on a large scale panel level for increased manufacturing efficiency. In the exemplary embodiment shown in FIGS. 7 and 8, trenches 54 are formed as linear channels, slots, or grooves, which extend along dicing streets 34 (FIGS. 3-5) and define, in substantial part, vertical sidewalls 56 (identified in FIG. 8) of the partially-completed stacked microelectronic packages 57 (only one of which is labeled in FIG. 8). Trenches 54 are further formed such that each trench 54 extends along the length of a different dicing street 34 (FIGS. 3-5) and, thus, trenches 54 collectively form an intersecting grid or lattice to allow vertical interconnection of the stacked packages on three or four vertical sides thereof. Trenches 54 can be readily formed utilizing a conventional dicing saw (e.g., a water-cooled diamond saw) having a predetermined blade width defining the trench width (identified as "$W_1$" in FIG. 8). Mechanical sawing is a highly efficient process, especially in embodiments wherein trenches 54 are formed as a linear cuts extending entirely across the body of panel stack 46. However, while it is generally preferred that trenches 54 are produced utilizing mechanical sawing for reasons of simplicity and efficiency, trenches 54 can be formed utilizing other material-removal processes including, for example, laser ablation, routing, and mechanical drilling.

The illustrated example notwithstanding, trenches 54 need not extend entirely across the face of panel stack 46 in all embodiments. Instead, in alternative embodiments, trenches 54 may be formed at discrete locations, whether by sawing or other material removal means, providing that trenches 54 intersect and expose package edge conductors 32 to enable interconnection of embedded microelectronic devices 28 in the manner described below. Furthermore, while conveniently formed to be non-penetrating or blind, trenches 54 may be fully penetrating or partially penetrating in certain embodiments. For example, trenches 54 may be fully penetrating (that is, trenches 54 may extend entirely through lower device panel 44) in embodiments wherein lower device panel 44 is further releasably bonded to a support substrate and/or in embodiments wherein trenches 54 do not extend entirely across panel stack 46. In still further embodiments, panel stack 46 may be cut into a number of elongated strips during STEP 52 (FIG. 1) and the below-described process steps may be performed using the elongated panel strips as opposed to whole device panels. Moreover, in embodiments wherein vertical interconnection of the stacked microelectronic packages is required or desired only for one or two of the package sidewalls, a single series of generally parallel, non-intersecting trenches may be formed during STEP 52 of exemplary method 20 (FIG. 1).

Figure 9:
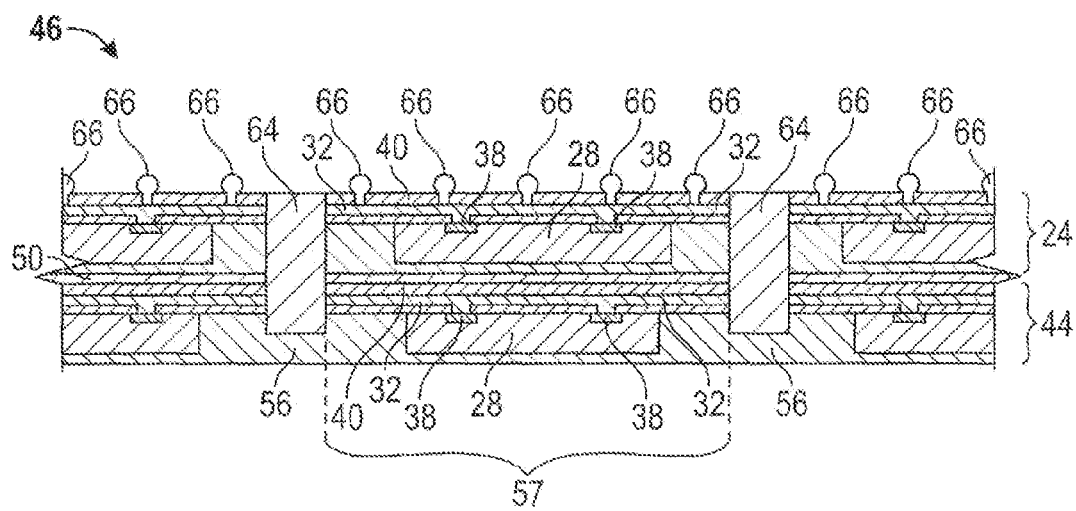

Referring once again to FIG. 1, and specifically to PROCESS BLOCK 60 of flowchart 20, sidewall conductors are next formed within conductor-exposing trenches 54 to electrically connect package edge conductors 32 and thereby interconnect the stacked microelectronic devices 28 embedded within panels 24 and 44. In this regard, an electrically-conductive material may first be deposited into trenches 54 such that the material contacts the terminal ends of package edge conductors 32 exposed through the vertical trench sidewalls (STEP 62, FIG. 1). The electrically-conductive material deposited into trenches 54 can be a metal plated onto the trench sidewalls (i.e., the partially-defined package sidewalls) utilizing chemical vapor deposition (CVD), physical vapor deposition (PVD), or other plating process. However, as trenches 54 will often be formed to have relatively large dimensions and high aspect ratios, such metal plating processes will generally be undesirably time consuming and cumbersome to implement. In addition, removal of a metal film using laser ablation (as performed in preferred embodiments of method 20 described below in conjunction with STEP 68 of exemplary method 20) can require undesirably high energy levels and generate undesirable quantities of heat to remove the metal. For at least this reason, it is preferred in some embodiments that a flowable-conductive material is dispensed into trenches 54 during STEP 62 of exemplary method 20, the term "flowable-conductive material" denoting any material that is sufficiently flowable under process conditions to permit bulk inflow into and at least partial filling of trenches 54. The resulting structure is shown in FIG. 9 wherein the conductor-exposing trenches 54 have been filled with an electrically-conductive material 64. The deposition of electrically-conductive material 64 into the areas of trenches 54 (FIGS. 7 and 8) is ideally controlled such that little to no conductive material is deposited over the upper surface of panel stack 46 to avoid undesired contamination.

A non-exhaustive list of flowable conductive materials suitable for usage during the above-described trench filling process includes nanoparticle-filled inks, electrically-conductive polymers, solder pastes, solder-filled adhesives and metal-containing adhesives or epoxies, such as silver-, nickel-, and copper-filled epoxies (collectively referred to herein as "electrically-conductive pastes"). Suitable flowable conductive materials also include low melt point metals and alloys not including resins or fluxes and having melting points below 300° C. including, but not limited to, indium and bismuth. The term "flowable conductive material" expressly excludes metals and alloys, such as copper and tungsten, deposited using PVD, CVD, or a similar atomic-level deposition process. Whether the sidewall conductors are fabricated from a flowable conductive material, as defined above, or from a plated metal film results in a structural difference in the microstructure of the sidewall conductors (e.g., whether the microstructure is columnar), which can be observed utilizing a scanning electron microscope or similar inspection tool.

Different dispensing techniques can be employed to direct the electrically-conductive paste into trenches 54 (FIGS. 7 and 8) including, but not limited to, stencil or screen printing, squeegee application, needle dispensing, jetting, and the like. In one embodiment, the conductive paste is a silver-filled epoxy dispensed into trenches 54 in sufficient quantity to substantially fill each trench 54 utilizing a screen printing technique. After deposition of the electrically-conductive material into trenches 54, a thermal cure may be performed, if needed. If performed, the parameters of the thermal cure will vary depending upon the dispensed volume and the particular composition of electrically-conductive material 64 (FIG. 9); however, to provide a general example wherein a commercially-available metal-filled epoxy is utilized to fill trenches 54, an oven cure may be performed at a temperature of about 150° C. to about 200° C. for a duration of about one hour. As further indicated in FIG. 9, a solder BGA including a plurality of solder balls 66 may be formed over the uppermost surface of upper device panel 24 prior to or subsequent deposition of electrically-conductive material 64 into the conductor-exposing trenches. The BGA may be formed utilizing well-known "bumping" process techniques, such as photolithographical patterning of the uppermost dielectric or passivation layer 40 and subsequent deposition of solder balls 66. In further embodiments, BGA formation may be performed at a different juncture in the fabrication process and/or different contact formations (e.g., leads) may be employed.

Figure 10:
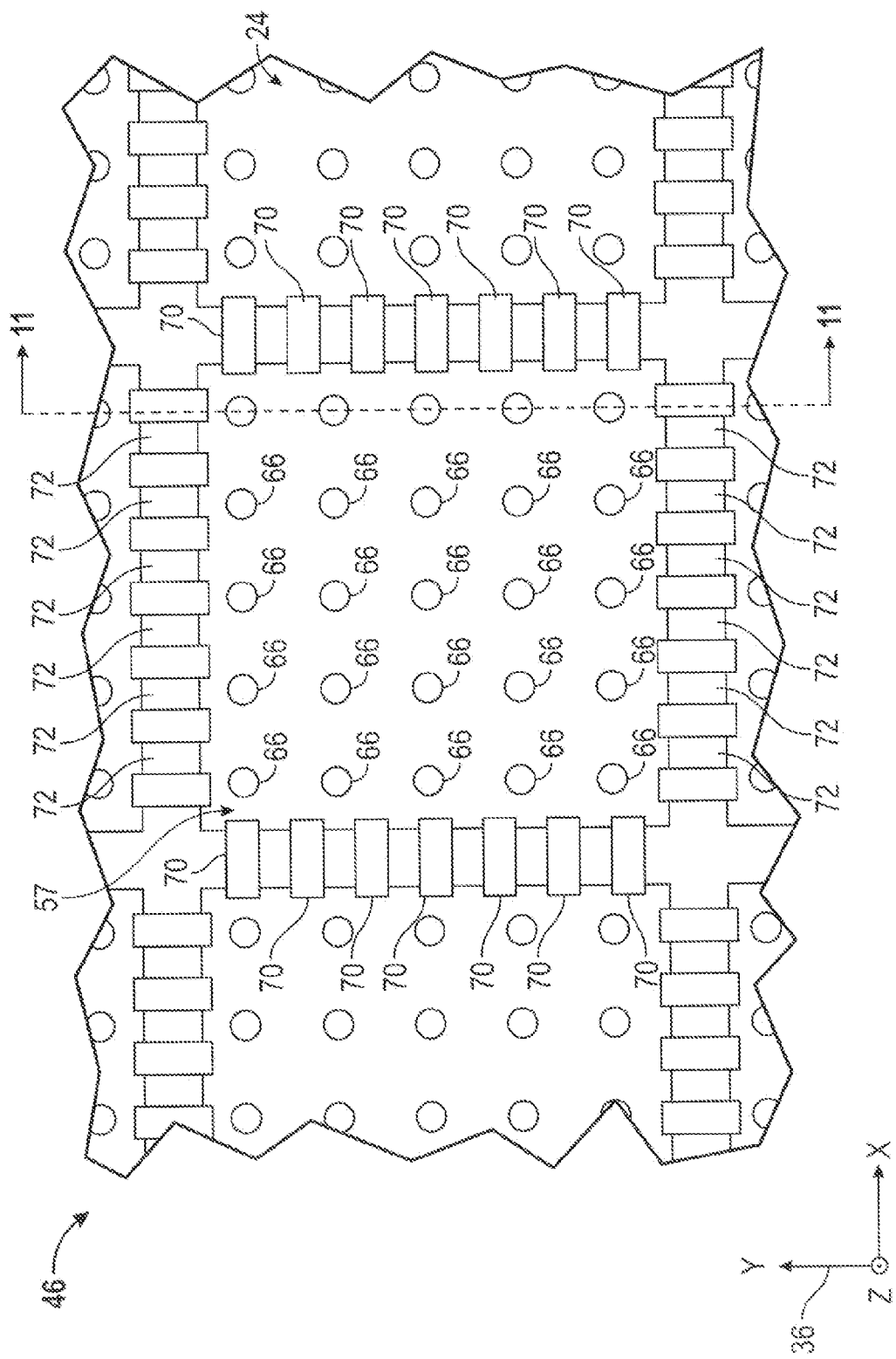
Figure 11:
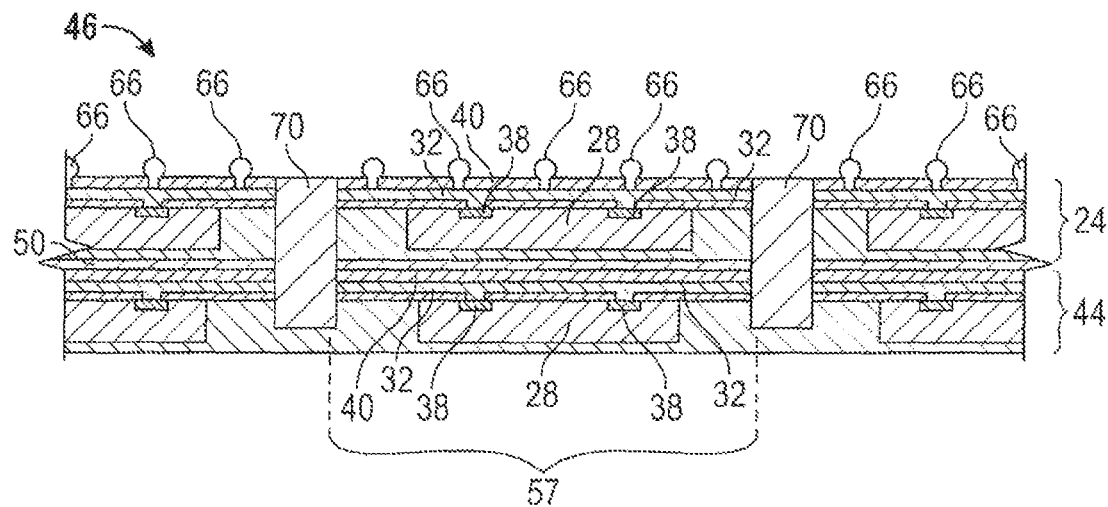

Next, at STEP 68 of exemplary method 20 (FIG. 1), selected portions of the electrically-conductive material 64 are removed to define, at least in part, a number of electrically-isolated sidewall conductors. FIG. 10 illustrates, from a top-down perspective, a portion of panel stack 46 illustrating one manner in which stack 46 may appear after selective removal of electrically-conductive material 64. As can be seen, vertical columns of electrically-conductive material 64 have been removed from the filled trenches to yield a series of vertical holes or openings 70, which are linearly spaced apart along the x- and y-axes (identified in FIG. 10 by axes legend 36) and define, in substantial part, a plurality of electrically-isolated sidewall conductors 72. Each vertical opening 70 extends across the body of electrically-conductive material 64 or the filled trench from, and possibly into, the vertical sidewall of a first stacked package to, and possibly into, the facing sidewall of a neighboring stacked package. Additionally, each vertical opening 70 will typically extend entirely through the body of electrically-conductive material 64 deposited into the trenches, as taken in a vertical direction along the z-axis identified by axes legend 36 or as taken through the thickness of panel stack 46. Openings 70 may extend into lower connecting portions 56 of bottom device panel 44 or entirely through panel stack 46. This may be more fully appreciated by referring to FIG. 11, which illustrates in cross-section the portion of panel stack 46 shown in FIG. 10 as taken along line 11-11. Openings 70 are designated by cross-hatching in FIG. 11 for increased clarity. By forming each opening to extend through and across the filled trenches in this manner, vertical openings 70 provide electrical isolation between neighboring sidewall conductors 72 included within each partially-fabricated stacked package 57. Openings 70 are dispersed or interleaved with sidewall conductors 72. While having generally rectangular planform geometry in the illustrated example, openings 70 can be formed to have various different planform geometries in alternative embodiments, including rounded, oval, or square-shaped geometries.

Vertical openings 70 can be formed during STEP 68 of exemplary method 20 (FIG. 1) utilizing mechanical drilling, routing, or any other suitable material removal process. In a preferred implementation, laser ablation is utilized to remove selected portions or vertical columns of material 64 and produce openings 70. Laser ablation can be performed with a standard UV or $CO_2$ laser drilling machine. Notably, in embodiments wherein the electrically-conductive material deposited into trenches 54 (FIGS. 7 and 8) is an electrically-conductive paste or epoxy, the laser ablation process can be carried-out at significantly lower energies than typically required to remove metal film deposited utilizing CVD, PVD, or a similar deposition technique. For example, and with the understanding that the requisite laser energy will inevitably vary between different electrically-conductive pastes and different metals, electrically-conducive pastes and epoxies of the type described herein can often be removed at laser energy levels below about 3 Watts, while energy levels of at least about 6 Watts and commonly exceeding about 8 Watts are typically required to remove plated metal films. Thus, in embodiments wherein laser ablation is utilized to remove selected portions or vertical columns of the electrically-conductive material deposited into the trenches, the maximum energy level is preferably less than about 4 Watts and, more preferably, less than about 3 Watts. By employing such a low energy laser ablation process to form vertical openings 70, undesired heating of the surrounding portions of microelectronic panel stack 46 can be avoided, which could otherwise damage or structurally degrade panel stack 46 by, for example, accelerating delamination and separation of the stacked packages or package layers. Exceptionally high product yields can be achieved by utilizing such a laser ablation process on a panel level.

Figure 12:
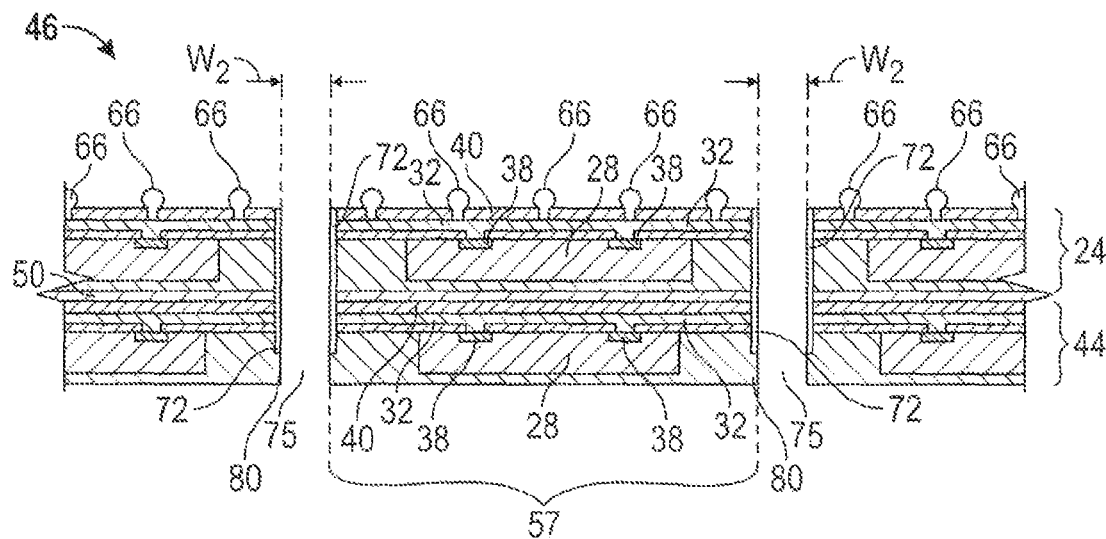

To complete exemplary method 20 (FIG. 1), the panel stack is separated or singulated into a number of stacked microelectronic packages (STEP 74, FIG. 1). FIG. 12 is a cross-sectional view of a portion of exemplary panel stack 46 after singulation to yield a plurality of stacked microelectronic packages 76 (only one of which is fully shown in FIG. 12). Singulation may be carried-out utilizing any known process including laser cutting, mechanical sawing, and scribing with punching. Singulation further removes the conductive material joining the sidewall-conductors of neighboring packages and, thus, fully defines (in combination with formation of openings 70 shown in FIGS. 10 and 11) electrically-isolated sidewall conductors 72, which interconnect embedded microelectronic devices 28 by way of package edge conductors 32, as described more fully below. If laser cutting, mechanical sawing, or another material removal process is employed, the cuts 75 created by such a process are preferably formed to have a predetermined uniform width (identified in FIG. 12 as "$W_2$"), which is less than the predetermined uniform trench width (identified in FIG. 8 as "$W_1$"). The thickness of the sidewall conductors will be equivalent to one half the difference between $W_1$ and $W_2$. In one embodiment wherein trenches 54 are formed utilized a first dicing saw having a first blade thickness equivalent to the desired trench width ($W_1$), singulation of panel stack 46 is carried-out by dicing using a second a dicing saw having a predetermined blade thickness equivalent to the desired cut width ($W_2$) and less than the first predetermined blade thickness ($W_1$).

Figure 13:
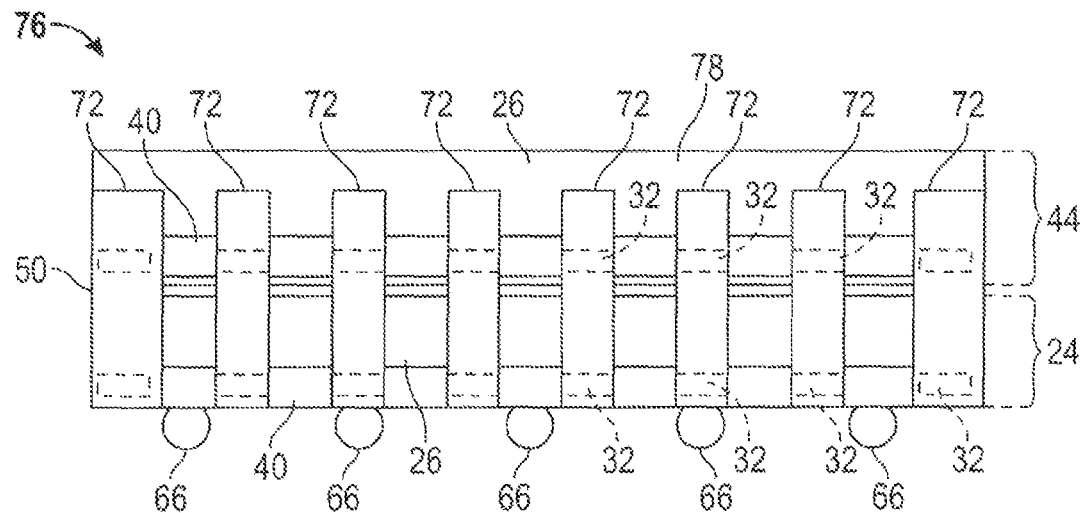
Figure 14:
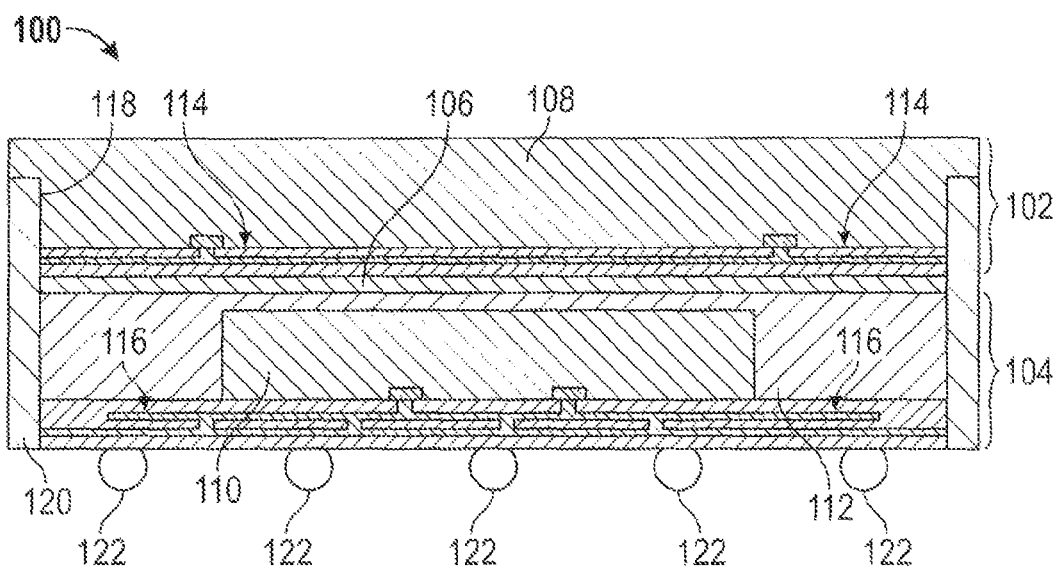
FIGS. 14-17 are simplified cross-sectional views illustrating different types of stacked microelectronic packages, which can be produced utilizing the fabrication method illustrated in FIG. 1 in accordance with still further exemplary embodiments of the present invention.
Figure 15:
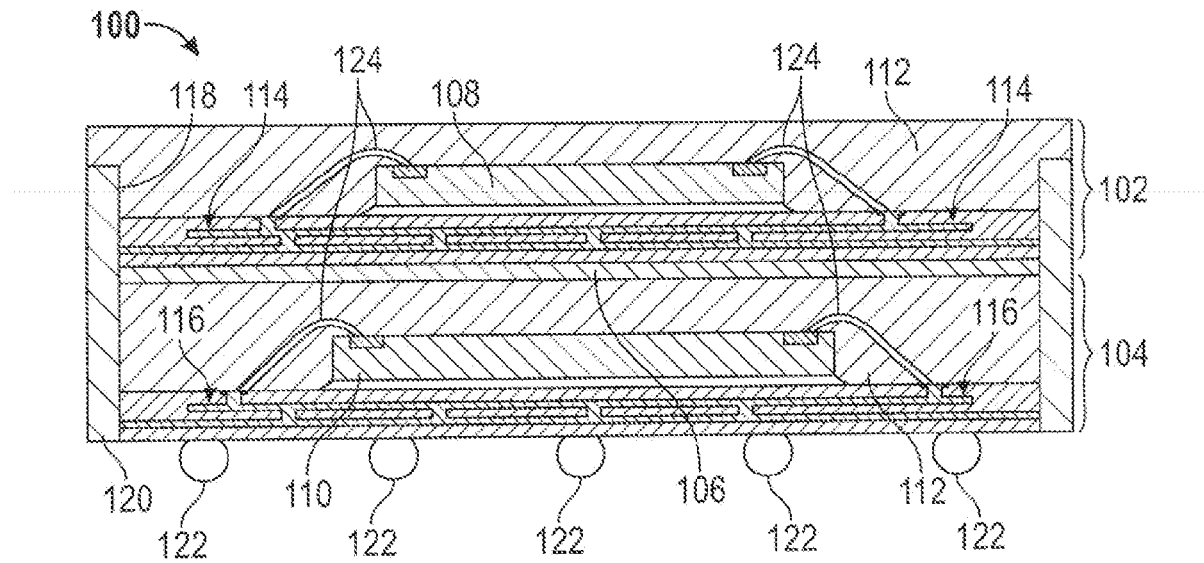
Figure 16:
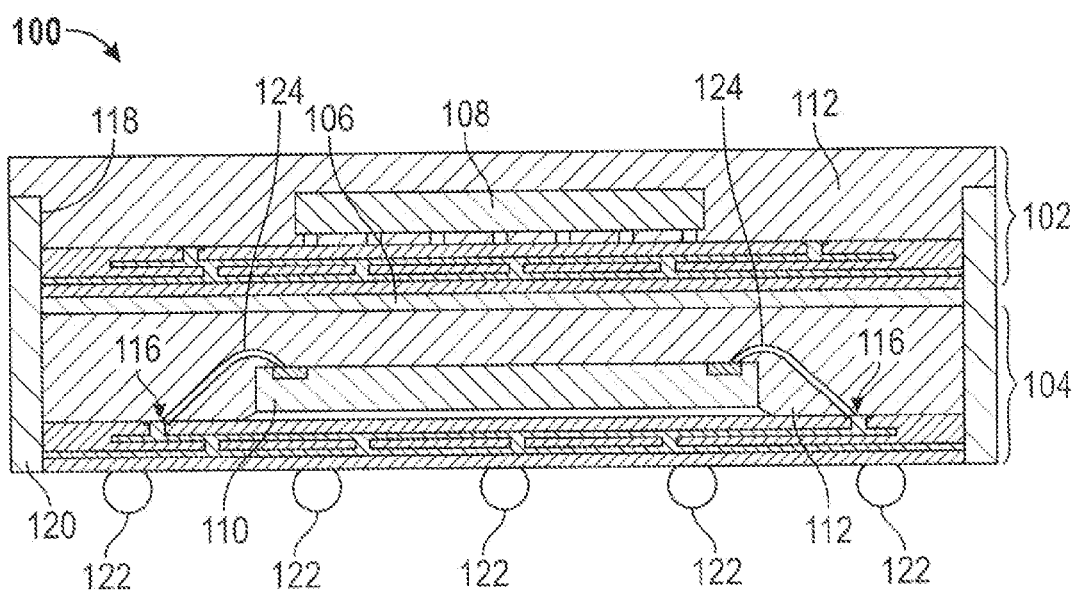
Figure 17:
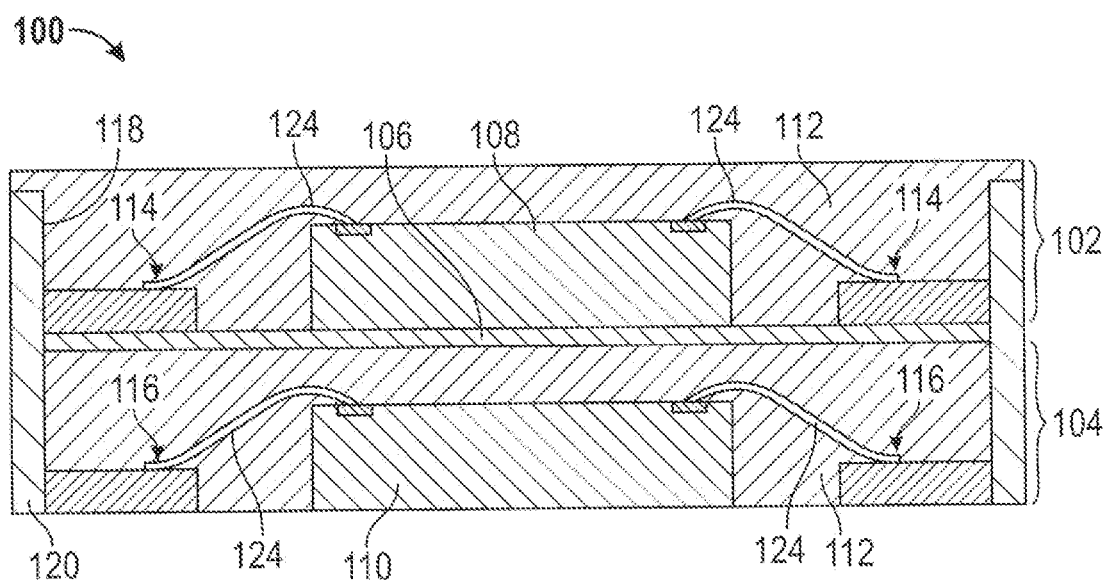

Pursuant to the completion of exemplary fabrication method 20, a number of stacked microelectronic packages has now been formed. FIG. 13 illustrates, in side view, one such microelectronic package 76. Stacked microelectronic package 76 includes two packages or package layers 78 and 80, which are singulated portions of device panels 24 and 44 (FIGS. 5-9, 11, and 12), respectively, and each of which contains at least one embedded microelectronic device. Each package layer 78, 80 also includes a number of package edge conductors 32 (physically covered in FIG. 13 and thus illustrated in phantom) extending to the illustrated vertical package sidewall 82 to contact, and thus electrically connect, different ones of package edge conductors 32. In this manner, package edge conductors 32 interconnect the microelectronic devices embedded within package layers 78 and 80; however, it should be noted that package edge conductors 32 need not interconnect the microelectronic devices embedded within packages layers 78 and 80 in all embodiments and may, instead, be utilized to electrically couple one or more microelectronic devices included in the uppermost package layer (referring to the illustrated orientation) or any other package layer aside from the lowermost package layer to the contacts (e.g., solder balls, leads, etc.) formed over the lowermost surface of the stacked package. In the exemplary embodiment illustrated in FIG. 13, sidewall conductors 72 each have a substantially linear geometry and interconnect different overlying or vertically-aligning pairs of package edge conductor 32; however, sidewall conductors 72 can be imparted with other geometries (e.g., L-, U-, and block-shaped geometries) in alternative embodiments by limiting the penetration depth of selected ones of openings 70 described above in conjunction with FIGS. 10-12. Notably, stacked microelectronic package 76 may differ structurally from certain known stacked microelectronic packages in at least one several respects. First, at least in preferred embodiments, sidewall conductors 72 are composed or comprised of an electrically-conductive paste, such as a metal-containing epoxy or paste, of the type described above. Second, sidewall conductors 72 are formed directly over and intimately contact the package sidewalls and are not separated therefrom by, for example, a seed layer of the type commonly utilized in conjunction with plating processes. Third, as indicated in FIGS. 12 and 13 by reference numeral 82, lower device panel 44 includes a lower ledge or shelf, which is created by the trench formation or "half saw" process described above in conjunction with STEP 52 of exemplary method 20 (FIG. 1), which extends around the perimeter of panel 44, and to which sidewall conductors 72 extend from the contact surface of stacked microelectronic package 76 over which solder balls 66 are formed.

The foregoing has thus provided embodiments of a method for fabricating a plurality of stacked microelectronic packages including a number of sidewall conductors or interconnects. As embodiments of the above-described fabrication method are performed, at least in large part, on a panel or partial panel level, significant improvements in manufacturing efficiency, cost effectiveness, scalability, and productivity can be realized. Embodiments of the above-described fabrication method also eliminate or reduce the need for vertical connection between package layers utilizing BGAs or similar contact formations thereby enabling a more compact vertical device profile and decreasing manufacturing complexity. Furthermore, embodiments of the fabrication method described above employ uniquely-formed sidewall connectors to interconnect package layers, which provide superior layer-to-layer interconnectivity as compared to BGAs or similar contact formations.

In certain embodiments of the above-described fabrication method, a dielectric material may further be deposited over the vertical package sidewalls and in contact with the sidewall conductors formed thereover. In this case, the dielectric material is preferably occupies the area between the neighboring sidewall conductors. This may be accomplished by depositing dielectric material into the openings (e.g., the drill holes) created during the above-described material removal process carried-out during STEP 68 of exemplary method 20 (FIG. 1) and prior to the singulation process carried-out during STEP 74. The dielectric material may then be cut so as to be flush with the sidewall interconnects during the singulation process. In other embodiments, dielectric material may be deposited between, adjacent, and/or over the sidewall conductors after singulation. Various different dielectric materials suitable for this purpose are known; and various ones of the application techniques described above with the application of the flowable conductive material can be employed to deposit the dielectric including, for example, needle dispensing or screen-printing techniques. The deposition of such an dielectric material prevents or minimize dendritic growth that may otherwise occur due to surface migration of certain constituents (e.g., silver particles) included within the flowable conductive material from which the sidewall conductors are formed. In addition, the addition of such a dielectric material between the sidewall conductors may provide additional mechanical robustness and may be chosen to have better adhesive properties than the electrically-conductive material from which the sidewall conductors are formed.

While described above in conjunction with a particular stacked microelectronic package type, it is emphasized that embodiments of exemplary method 20 (FIG. 1) can be employed to fabricate various different types of stacked microelectronic package wherein at least two microelectronic devices are located on different levels or within different package layers and interconnected by way of electrically-isolated sidewall conductors of the type described above. Further emphasizing this point, FIGS. 14-17 are simplified cross-sectional views illustrating different types of stacked microelectronic packages, which can be produced utilizing method 20 illustrated in FIG. 1 in accordance with still further exemplary embodiments of the present invention. Using like reference numerals to designate like structural elements, FIGS. 14-17 each illustrate a relatively simple stacked microelectronic package 100 including a first package or package layer 102 and a second package or package layer 104. As was the case previously, package layers 102 and 104 are laminated by an intervening bonding layer 106, such as adhesive tape or bonding material. Package layers 102 and 104 each include at least one microelectronic device 108 and 110, respectively, which is embedded within the package body 112. Packages 102 and 104 further include package edge conductors 114 and 116, respectively, which extend to and are exposed through vertical package sidewalls 118. Sidewall conductors 120 are formed over vertical package sidewalls 118 and electrically interconnect the exposed terminal ends of package edge conductors 114 and 116 and, therefore, stacked microelectronic devices 108 and 110. As further shown in FIGS. 14-16, a plurality of solder balls 122 included within a BGA array may also be formed over the device surface of package 104 to facilitate electrical connection to printed circuit board or other component included within a larger electronic system.

As noted above, stacked microelectronic packages 100 are produced utilizing different paging approaches than was stacked microelectronic packages 76 described above in conjunction with FIGS. 1-13. For example, in the case of package 100 shown in FIG. 14, package layers 102 and 104 are produced utilizing Wafer-Level Chip-Scale Packaging (WL-CSP) and RCP packaging processes, respectively. In the exemplary embodiment illustrated in FIG. 15, package layers 102 and 104 are each produced utilizing a Molded Array Process Ball Grid Array (MAPBGA) process. In the exemplary embodiment illustrated in FIG. 16, package layers 102 and 104 are produced utilizing a hybrid Flip-Chip Ball Grid Array (FCBGA) and MAPBGA processes, respectively. Finally, in the exemplary embodiment illustrated in FIG. 17, package layers 102 and 104 are each produced utilizing a sawn Quad-Flat No-Lead (QFN) strip level stacking process. The package edge conductors can be formed in a single metal layer, as in the case of conductors 114 shown in FIG. 14; as a combination of conductive lines, vias, and the like formed in multiple dielectric or build-up layers, as in the case of conductors 116 shown in FIG. 14, conductors 114 and 116 shown in FIG. 15, and conductors 114 and 116 shown in FIG. 16; as wire bonds 124 electrically coupled to conductive lines, as in the case of conductors 114 and 116 shown in FIG. 15 and conductors 116 shown in FIG. 16; or as wire bonds 124 electrically coupled to bond pads exposed through the package sidewall, as in the case of conductors 114 and 116 shown in FIG. 17.

It should thus be appreciated that there has been provided multiple exemplary embodiments of a method for fabricating stacked microelectronic packages, which provides excellent level-to-level interconnectivity through multiple package stacking, as well as package miniaturization and ultra-high density package. In certain embodiments of the above-described method, device panels were produced each containing multiple semiconductor die (or other microelectronic devices) and package edge conductors (e.g., metal traces) connecting the die pads to the saw scribe or dicing streets. Two or more panels were laminated with appropriate alignment and bonding material. In at least one of the above-described exemplary embodiments, a partial saw was then applied to cut the panels to the bottommost panel and expose the package sidewall conductors. An electrically-conductive material, such as a metal-containing paste, was then utilized to fill the grooves formed by partial saw. Laser ablation was then performed from top or device side of the panel stack to remove the excessive material in between the traces. Finally, the laminated panels were singulated into single units.

In some of the above-described exemplary embodiments, the fabrication method includes the step of arranging a plurality of microelectronic device panels in a panel stack. Each microelectronic device panel contains plurality of microelectronic devices and a plurality of package edge conductors extending therefrom. Trenches are created in the panel stack exposing the plurality of package edge conductors, and a plurality of sidewall conductors is formed interconnecting different ones of the package edge conductors exposed through the trenches. The panel stack is then separated into a plurality of stacked microelectronic packages each including at least two microelectronic devices electrically interconnected by at least one of the plurality of sidewall conductors included within the stacked microelectronic package.

In further embodiments, the method includes the step of stacking at least first and second device panels to produce a panel stack. The first microelectronic device panel includes a panel body, a plurality of microelectronic devices embedded in the panel body, dicing streets bordering the plurality of microelectronic devices, and a plurality of package edge conductors extending from the microelectronic devices to the dicing streets. Trenches are cut into the panel stack along the dicing streets exposing the plurality of package edge conductors. The trenches are then filled with an electrically-conductive material contacting the package edge conductors exposed through the trench sidewalls. Openings are then formed through the electrically-conductive material filling the trenches to at least partially define a plurality of sidewall conductors electrically-coupled to the plurality of package edge conductors. The panel stack is singulated into the plurality of stacked microelectronic packages.

In still further embodiments, the method includes the step of producing a plurality of device panels each including electrically-conductive elements, such as package-edge conductors of the type-described above; and laminating a plurality of device panels to produce a panel stack in which the electrically-conductive elements are embedded. Non-penetrating openings are formed in the panel stack defining, at least in part, package sidewalls through which the embedded electrically-conductive elements are exposed. An electrically-conducive paste is dispensed into the non-penetrating openings. Selected portions of the electrically-conductive paste are then removed to define, at least in part, a plurality of electrically-isolated sidewall conductors interconnecting the electrically-conductive elements exposed through the non-penetrating openings. The panel stack is then singulated into the plurality of stacked microelectronic packages.

Embodiments of a stacked microelectronic package have also been provided. In one embodiment, the stacked microelectronic package comprises a plurality of overlying package layers. Each package layer includes, in turn, a package layer body, a microelectronic device embedded in the package layer body, and a plurality of package edge conductors extending from the electronic device to a sidewall of the package body. The plurality of package edge conductors are exposed through the sidewall of the package layer body. The stacked microelectronic package further includes plurality of sidewall conductors, which are composed of an electrically-conductive paste deposited over at least one sidewall of the package layer body and which are in ohmic contact with the plurality of package edge conductors exposed therethrough.

In embodiments of the above-described fabrication method, trenches are formed in the panel stack and at least partially filled with a conductive material, such as a metal-containing paste. Openings are then formed through the filled trenches to define, in part, the electrically-isolated sidewall conductors; and then singulation is performed to separate the stacked microelectronic packages and fully define the sidewall conductors. It is also possible, in further embodiments of the fabrication method, to singulate the panel stack prior to removal of selected portion of the electrically-conductive material deposited over the package sidewalls. For example, after deposition of an electrically-conductive paste or other material into the trenches, the panel stack may be singulated into a plurality of partially-completed stacked microelectronic packages each having an unpatterned layer of electrically-conductive material overlying at least one of the vertical package sidewalls. The unpatterned layer of electrically-conductive material may then be patterned to define the sidewall conductors. Notably, in embodiments wherein an electrically-conductive paste or similar material is deposited into the trenches, the unpatterned layer of electrically-conductive paste can be patterned utilizing a low energy laser ablation of the type described above to avoid the creation of heat-affected zones of the stacked microelectronic package. Such post-singulation patterning of an unpatterned electrically-conductive sidewall layer also enables the sidewall conductors to be imparted with more complex, patterned shapes. Examples of such an alternative fabrication method is described more fully in co-pending U.S. patent application Ser. No. 13/591,969, filed with the USPTO on Aug. 22, 2012, and incorporated by reference above.

While at least one exemplary embodiment has been presented in the foregoing Detailed Description, it should be appreciated that a vast number of variations exist. It should also be appreciated that the exemplary embodiment or exemplary embodiments are only examples, and are not intended to limit the scope, applicability, or configuration of the invention in any way. Rather, the foregoing Detailed Description will provide those skilled in the art with a convenient road map for implementing an exemplary embodiment of the invention. It being understood that various changes may be made in the function and arrangement of elements described in an exemplary embodiment without departing from the scope of the invention as set-forth in the appended claims.

What is claimed is:

1. A method for fabricating stacked microelectronic packages, comprising:
    arranging a plurality of microelectronic device panels in a panel stack, each microelectronic device panel containing plurality of microelectronic devices and a plurality of package edge conductors extending therefrom;
    creating trenches in the panel stack exposing the plurality of package edge conductors;
    forming a plurality of sidewall conductors interconnecting different ones of the package edge conductors exposed through the trenches, forming comprising:
        depositing an electrically-conductive material into the trenches contacting the plurality of package edge conductors to produce conductor-filled trenches; and
        removing selected portions of the electrically-conductive material to produce a series of linearly-spaced vertical openings in each conductor-filled trench, the series of linearly-spaced vertical openings partially defining the plurality of sidewall conductors; and
    separating the panel stack into a plurality of stacked microelectronic packages each comprising at least first and second sidewall conductors, the first sidewall conductor electrically isolated from the second sidewall conductor by one of the linearly-spaced vertical openings during removal of selected portions of the electrically-conductive material.

2. A method according to claim 1 wherein depositing comprises dispensing an electrically-conductive paste into the trenches.

3. A method according to claim 2 wherein dispensing comprises filling the trenches at least partially with a metal-containing epoxy.

4. A method according to claim 2 wherein the selected portions of the electrically-conductive material are removed by drilling the series of linearly-spaced vertical openings into the electrically-conductive paste after dispensing the electrically-conductive paste into the trenches.

5. A method according to claim 4 wherein drilling comprises removing vertical columns of the electrically-conductive paste utilizing a laser ablation process.

6. A method according to claim 1 wherein arranging comprises bonding together at least two neighboring microelectronic device panels to produce the panel stack.

7. A method according to claim 1 wherein the plurality of microelectronic device panels are produced using a process comprising:
    embedding microelectronic devices in an encapsulant having a device surface through which the microelectronic devices are exposed; and
    forming the package edge conductors over the device surface and electrically coupled to the microelectronic devices.

8. A method according to claim 1 wherein the microelectronic device panels comprise dicing streets to which the plurality of package edge conductors extend, and wherein the step of arranging comprises arranging the device panels in a panel stack such that the dicing streets of the device panels at least partially overlap, as taken along a centerline of the panel stack.

9. A method according to claim 1 wherein the microelectronic device panels comprise dicing streets to which the plurality of package edge conductors extend, and wherein the step of creating comprises cutting trenches into the panel stack along the dicing streets and transecting the plurality of package edge conductors.

10. A method according to claim 9 wherein cutting comprises cutting trenches into the panel stack and having a first predetermined width, and wherein separating comprises singulating the panel stack into a plurality of stacked microelectronic packages utilizing a saw having a blade thickness less than the first predetermined width.

11. A method according to claim 1 wherein creating comprises cutting trenches in the panel stack such that a portion of each of the plurality of package edge conductors is removed.

12. A method according to claim 1 further comprising depositing a dielectric material between the sidewall conductors.

13. A method for fabricating stacked microelectronic packages, comprising:
    stacking at least first and second device panels to produce a panel stack, the first microelectronic device panel comprising:
        a molded panel body;
        a plurality of microelectronic devices embedded in the molded panel body;
        dicing streets bordering the plurality of microelectronic devices; and
        a plurality of package edge conductors extending from the microelectronic devices to the dicing streets;
    cutting trenches into the panel stack along the dicing streets exposing the plurality of package edge conductors and at least partially defining one or more sidewalls of each of the plurality of stacked microelectronic packages;
    filling the trenches with an electrically-conductive material to produce electrically-conductive bodies within the trenches contacting the package edge conductors exposed through the trench sidewalls;
    forming a plurality of spaced-apart vertical openings in each electrically-conductive bodies to at least partially define a plurality of sidewall conductors electrically-coupled to the plurality of package edge conductors, the plurality of spaced-apart vertical openings extending into the sidewalls of the plurality of stacked microelectronic packages to provide electrical isolation between the neighboring sidewall conductors of each stacked microelectronic package; and
    after forming the plurality of spaced-apart vertical openings, singulating the panel stack into the plurality of stacked microelectronic packages to fully define the sidewall conductors and to separate the plurality of stacked microelectronic packages.

14. A method according to claim 13 further comprising producing a contact formation over a first stacked microelectronic package included within the plurality of stacked microelectronic packages prior to or after singulating the panel stack, at least one of the plurality of sidewall conductors electrically coupling at least one microelectronic device included within the first stacked microelectronic package to a contact included within the contact formation.

15. A method according to claim 13 wherein filling comprises dispensing an electrically-conductive paste into the trenches to produce a plurality of filled trenches, and wherein forming comprises drilling openings into the filled trenches each spaced-apart vertical opening extending across and through a filled trench.

16. A method according to claim 13 wherein cutting comprises cutting trenches into the panel stack extending through the second microelectronic device panel and extending into, but not through the first microelectronic device panel.

17. A method for fabricating stacked microelectronic packages, comprising:
- forming a trench between first and second stacked microelectronic packages extending along a first axis, the first and second stacked microelectronic packages each including a plurality of package edge conductors extending to the trench and a sidewall defined, at least in part, by the trench;
- filling the trench with an electrically-conductive material to produce a conductor-filled trench;
- forming linearly-spaced vertical openings in the conductor-filled trench to at least partially define a plurality of sidewall conductors electrically-coupled to the plurality of package edge conductors, the linearly-spaced vertical openings spaced along the first axis and extending into the sidewalls of the first and second stacked microelectronic packages; and
- singulating the first and second microelectronic stacked microelectronic packages to fully define the plurality of sidewall conductors and to separate the first and second microelectronic stacked microelectronic packages;
- wherein at least two first neighboring sidewall conductors included within the first microelectronic package are electrically isolated from one another by removal of material from the conductor-filled trench during formation of the linearly-spaced vertical openings, and wherein at least two second neighboring the sidewall conductors included within the second microelectronic package are electrically isolated from one another by removal of material from the conductor-filled trench during formation of the linearly-spaced vertical openings.

18. A method according to claim 17 wherein the linearly-spaced vertical openings extend at least partially through the conductor-filled trench, as taken along a second axis perpendicular to the first axis, and across the conductor-filled trench, as taken along a third axis orthogonal to the first and second axes.

19. A method according to claim 17 wherein the linearly-spaced vertical openings are interleaved with the plurality of sidewall conductors, as taken along the first axis.

20. A method according to claim 17 wherein forming comprises cutting the trench between the first and second stacked microelectronic package utilizing a first saw blade having a first thickness, wherein filling comprises filling the trench with a metal-containing epoxy to produce the conductor filled trench, wherein forming comprises removing vertical columns of material from the conductor-filled trench utilizing a laser ablation process to produce the linearly-spaced vertical openings through the trench partially defining the plurality of sidewall conductors, and wherein singulating comprises separating the first and second microelectronic packages by cutting through the partially defined sidewall conductors utilizing a second saw blade having a second thickness less than the first thickness.

* * * * *